(12) United States Patent
Kautzsch et al.

(10) Patent No.: US 12,332,271 B2
(45) Date of Patent: *Jun. 17, 2025

(54) CAPACITIVE MICROELECTROMECHANICAL DEVICE AND METHOD FOR FORMING A CAPACITIVE MICROELECTROMECHANICAL DEVICE

(71) Applicant: Infineon Technologies AG, Neubiberg (DE)

(72) Inventors: Thoralf Kautzsch, Dresden (DE); Steffen Bieselt, Stadt Wehlen (DE); Heiko Froehlich, Radebeul (DE); Andre Roeth, Dresden (DE); Maik Stegemann, Pesterwitz (DE); Mirko Vogt, Dresden (DE); Bernhard Winkler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 397 days.

This patent is subject to a terminal disclaimer.

(21) Appl. No.: 17/851,292

(22) Filed: Jun. 28, 2022

(65) Prior Publication Data
US 2022/0326275 A1 Oct. 13, 2022

Related U.S. Application Data

(62) Division of application No. 16/860,528, filed on Apr. 28, 2020, now Pat. No. 11,422,151, which is a
(Continued)

(30) Foreign Application Priority Data

Jul. 7, 2015 (DE) ..................... 10 2015 212 669.2

(51) Int. Cl.
*G01P 15/125* (2006.01)
*B81C 1/00* (2006.01)
(Continued)

(52) U.S. Cl.
CPC ........ *G01P 15/125* (2013.01); *B81C 1/00039* (2013.01); *G01P 15/0802* (2013.01);
(Continued)

(58) Field of Classification Search
CPC ............... G01P 15/125; G01P 15/0802; G01P 2015/0828; B81C 1/00039;
(Continued)

(56) References Cited

U.S. PATENT DOCUMENTS 3,416,373 A 12/1968 Havens
4,679,434 A 7/1987 Stewart
(Continued)

FOREIGN PATENT DOCUMENTS

DE 10003066 A1 8/2000
DE 102011112879 A1 4/2012
(Continued)

OTHER PUBLICATIONS

Sato et al., "Fabrication of Silicon-on-Nothing Structure by Substrate Engineering Using the Empty-Space-in-Silicon Formation Technique," Japanese Journal of Applied Physics, 2004, vol. 43(1), pp. 12-18.

*Primary Examiner* — Khaja Ahmad
*Assistant Examiner* — Sun Mi Kim King
(74) *Attorney, Agent, or Firm* — Harrity & Harrity, LLP

(57) ABSTRACT

A capacitive microelectromechanical device is provided. The capacitive microelectromechanical device includes a semiconductor substrate, a support structure, an electrode element, a spring element, and a seismic mass. The support structure, for example, a pole, suspension or a post, is fixedly
(Continued)

connected to the semiconductor substrate, which may comprise silicon. The electrode element is fixedly connected to the support structure. Moreover, the seismic mass is connected over the spring element to the support structure so that the seismic mass is displaceable, deflectable or movable with respect to the electrode element. Moreover, the seismic mass and the electrode element form a capacitor having a capacitance which depends on a displacement between the seismic mass and the electrode element.

13 Claims, 13 Drawing Sheets

Related U.S. Application Data division of application No. 15/200,299, filed on Jul. 1, 2016, now Pat. No. 10,684,306.

(51) Int. Cl.
G01P 15/08 (2006.01)
H01L 21/02 (2006.01)
H01L 21/768 (2006.01)

(52) U.S. Cl.
CPC .. *H01L 21/02104* (2013.01); *H01L 21/02697* (2013.01); *H01L 21/7688* (2013.01); *B81B 2201/0235* (2013.01); *B81B 2203/0118* (2013.01); *B81C 2201/0105* (2013.01); *B81C 2201/013* (2013.01); *G01P 2015/0828* (2013.01)

(58) Field of Classification Search
CPC ...... B81C 2201/0105; B81C 2201/013; H01L 21/02104; H01L 21/02697; H01L 21/7688; B81B 2201/0235; B81B 2203/0118; B81B 2203/058; B81B 2207/015
See application file for complete search history.

(56) References Cited

U.S. PATENT DOCUMENTS

| | | | |
|---|---|---|---|
| 5,095,750 A | 3/1992 | Suzuki et al. | |
| 5,095,752 A | 3/1992 | Suzuki et al. | |
| 5,239,871 A * | 8/1993 | Reidemeister | G01P 15/125 73/497 |
| 5,265,470 A | 11/1993 | Kaiser et al. | |
| 5,293,781 A | 3/1994 | Kaiser et al. | |
| 5,315,247 A | 5/1994 | Kaiser et al. | |
| 5,350,189 A | 9/1994 | Tsuchitani et al. | |
| 5,361,635 A | 11/1994 | Woodruff | |
| 5,367,429 A | 11/1994 | Tsuchitani et al. | |
| 5,377,545 A | 1/1995 | Norling et al. | |
| 5,503,018 A | 4/1996 | Norling et al. | |
| 5,506,454 A | 4/1996 | Hanzawa et al. | |
| 5,616,844 A | 4/1997 | Suzuki et al. | |
| 5,756,895 A | 5/1998 | Kubena et al. | |
| 6,327,909 B1 | 12/2001 | Hung et al. | |
| 6,388,300 B1 | 5/2002 | Kano et al. | |
| 6,422,077 B1 | 7/2002 | Krauss et al. | |
| 7,655,996 B1 | 2/2010 | Edelstein | |
| 8,481,400 B2 | 7/2013 | Kautzsch et al. | |
| 10,684,306 B2 | 6/2020 | Bieselt et al. | |
| 11,422,151 B2 | 8/2022 | Kautzsch et al. | |
| 2001/0001931 A1 | 5/2001 | Fujii et al. | |
| 2002/0104377 A1 | 8/2002 | Ishio | |
| 2002/0171328 A1 | 11/2002 | Otsuchi et al. | |
| 2003/0079543 A1 | 5/2003 | Potter | |
| 2003/0214200 A1 | 11/2003 | Thompson et al. | |
| 2004/0237650 A1 | 12/2004 | Yang | |
| 2007/0119252 A1 | 5/2007 | Adams et al. | |
| 2008/0072677 A1 | 3/2008 | Rhee et al. | |
| 2009/0115432 A1 | 5/2009 | Taniguchi et al. | |
| 2010/0116632 A1 | 5/2010 | Smith et al. | |
| 2010/0126273 A1 | 5/2010 | Lim et al. | |
| 2010/0301433 A1 | 12/2010 | Wu et al. | |
| 2011/0055981 A1 | 3/2011 | Voda et al. | |
| 2011/0174074 A1 | 7/2011 | Li et al. | |
| 2011/0318861 A1 | 12/2011 | Jahnes et al. | |
| 2013/0042695 A1 | 2/2013 | Barr et al. | |
| 2014/0260515 A1 | 9/2014 | Hazel et al. | |
| 2015/0145074 A1 | 5/2015 | Kolb et al. | |
| 2015/0162253 A1 | 6/2015 | Bieselt | |
| 2016/0209441 A1 | 7/2016 | Mazzeo et al. | |
| 2017/0227570 A1 | 8/2017 | Chatterjee et al. | |

FOREIGN PATENT DOCUMENTS

| | | |
|---|---|---|
| DE | 102013206328 A1 | 10/2014 |
| DE | 102015212669 A1 | 1/2017 |
| WO | 2014207709 A1 | 12/2014 |

* cited by examiner

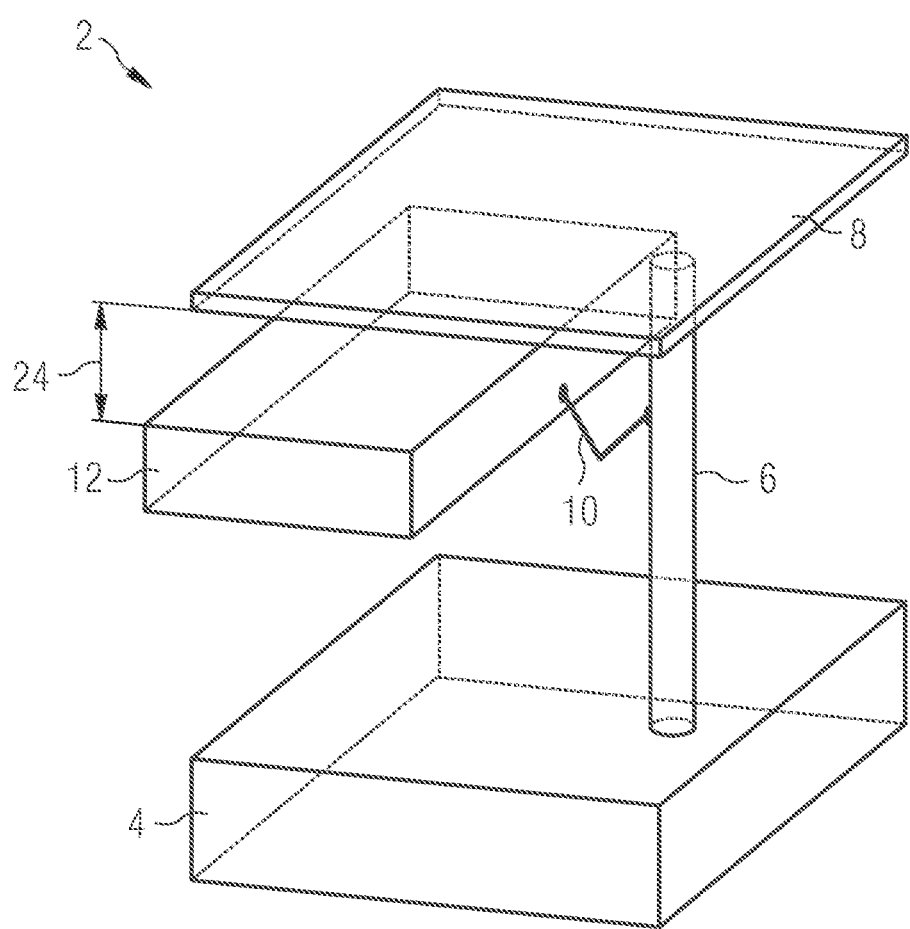

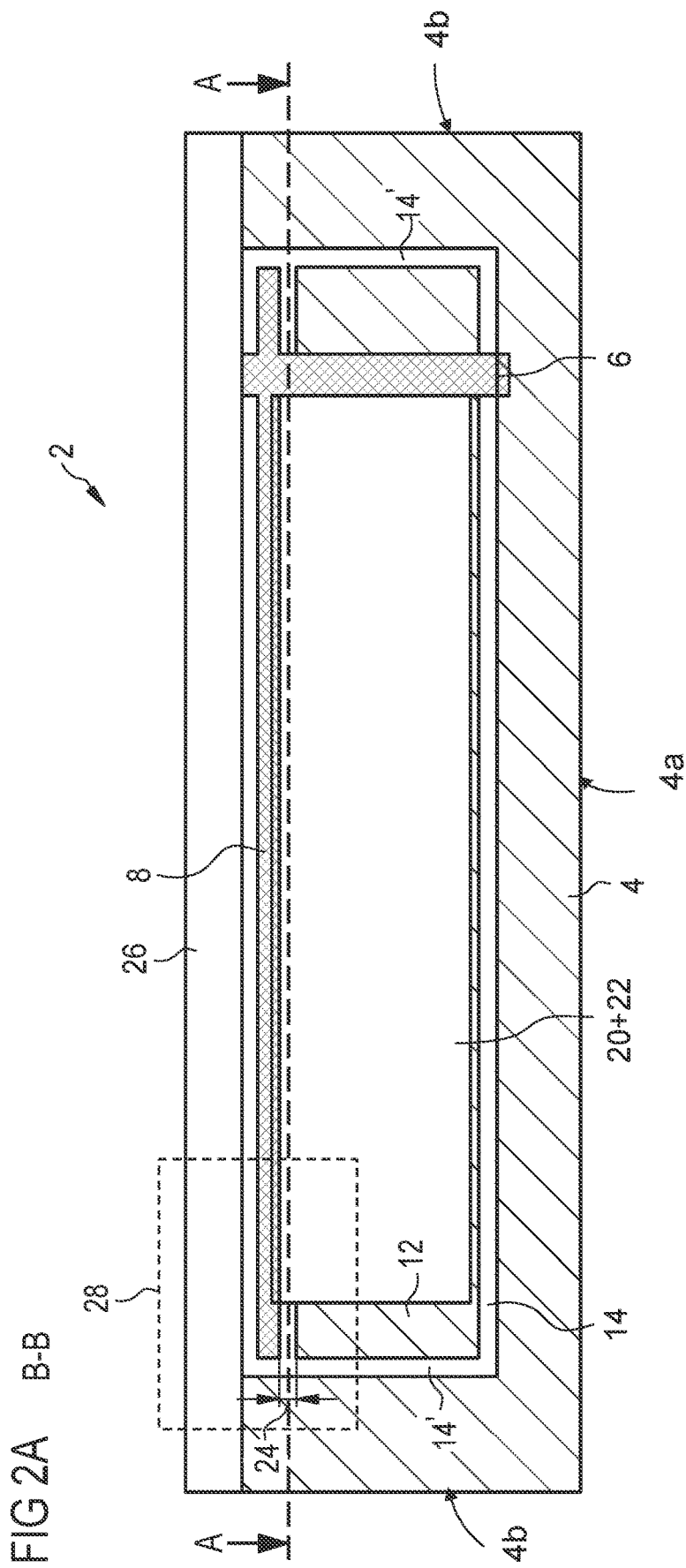
FIG 2A B-B

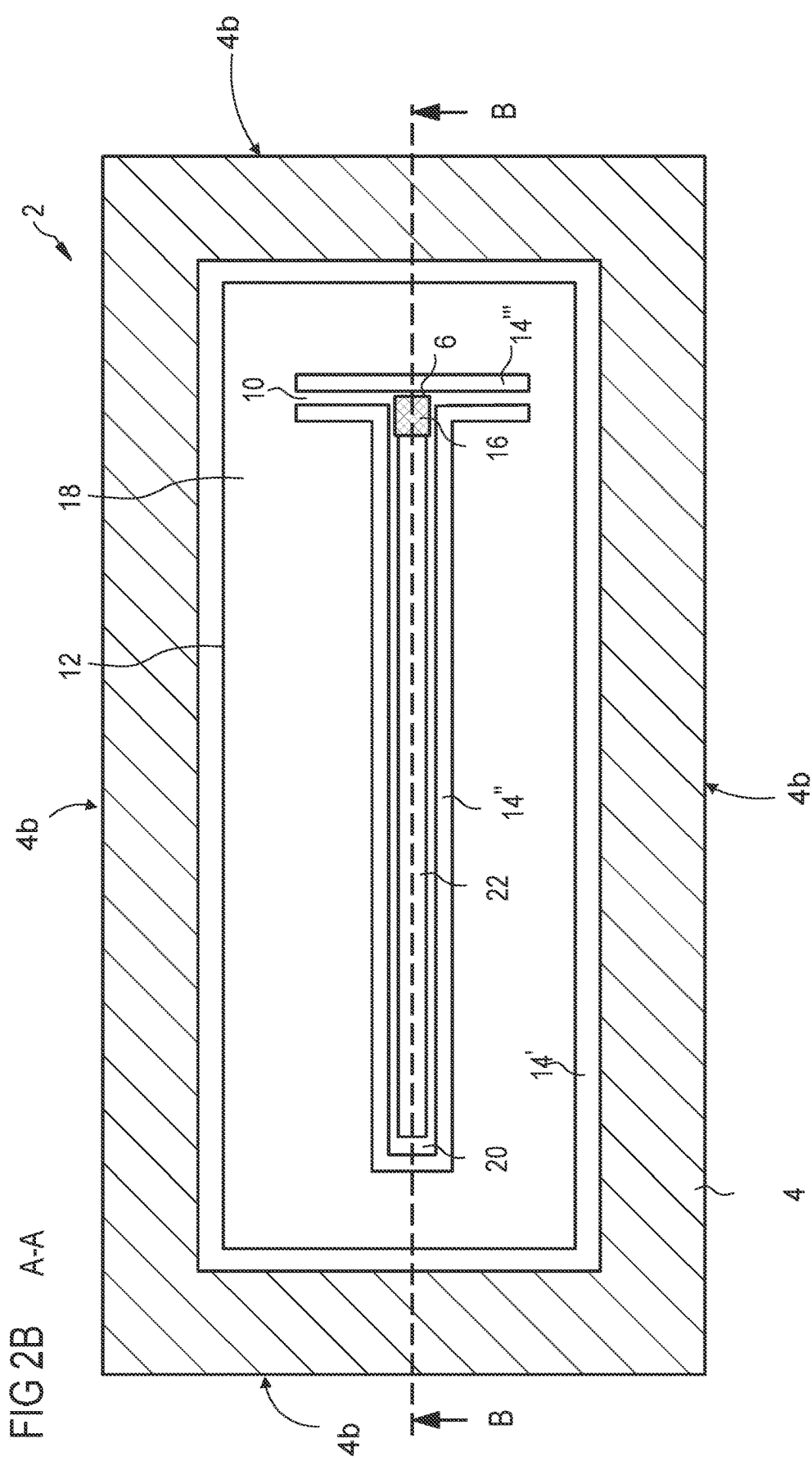

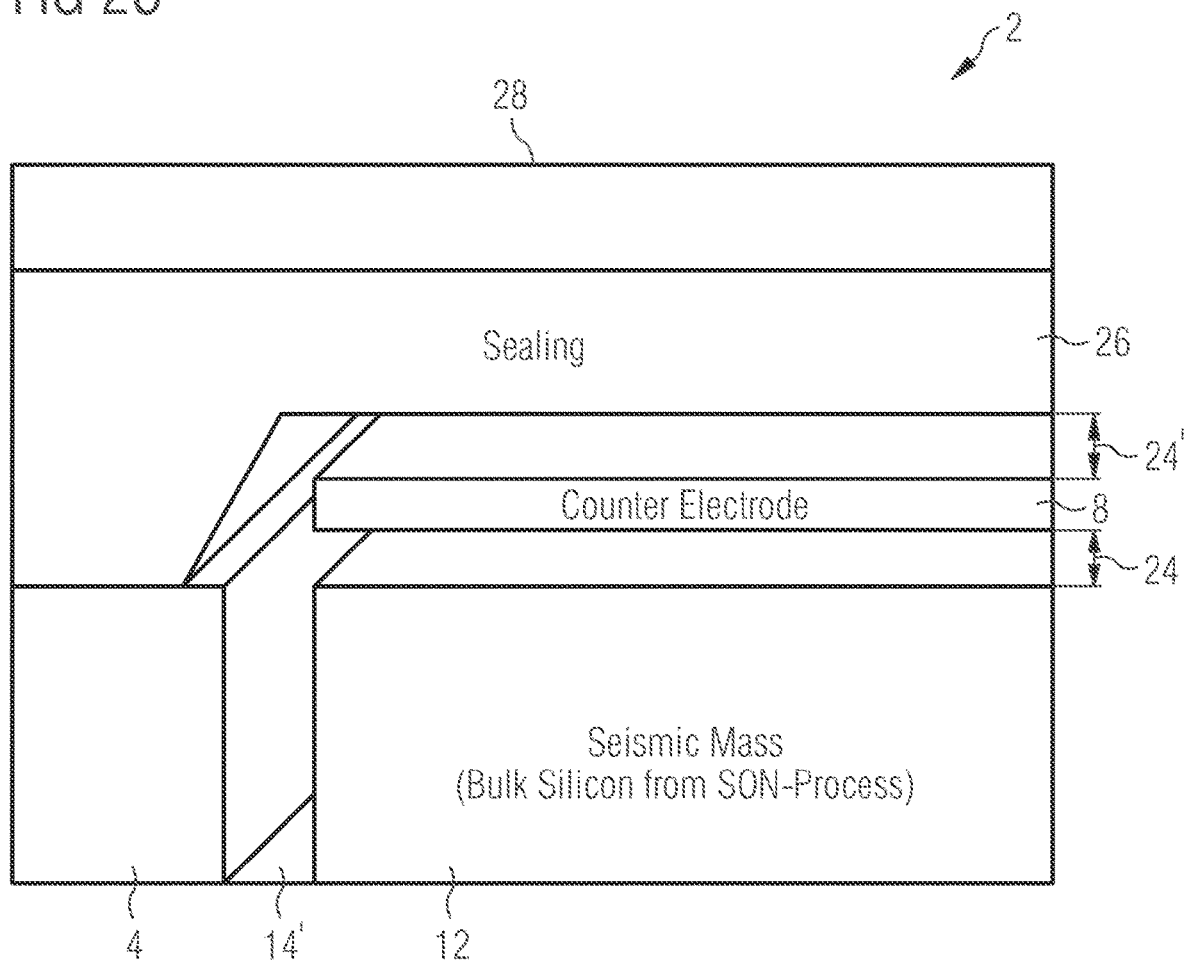

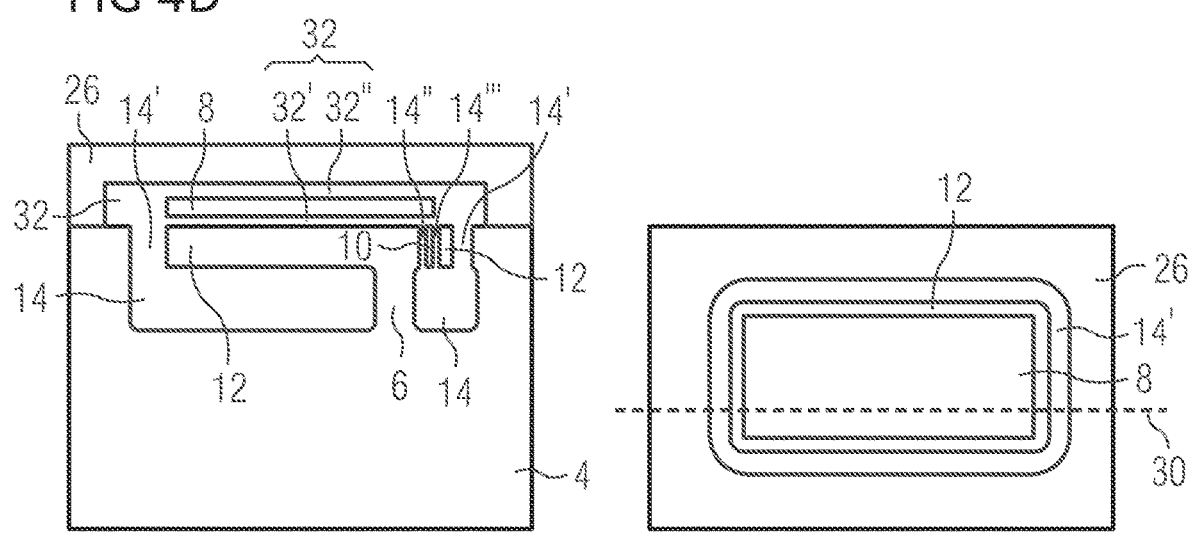
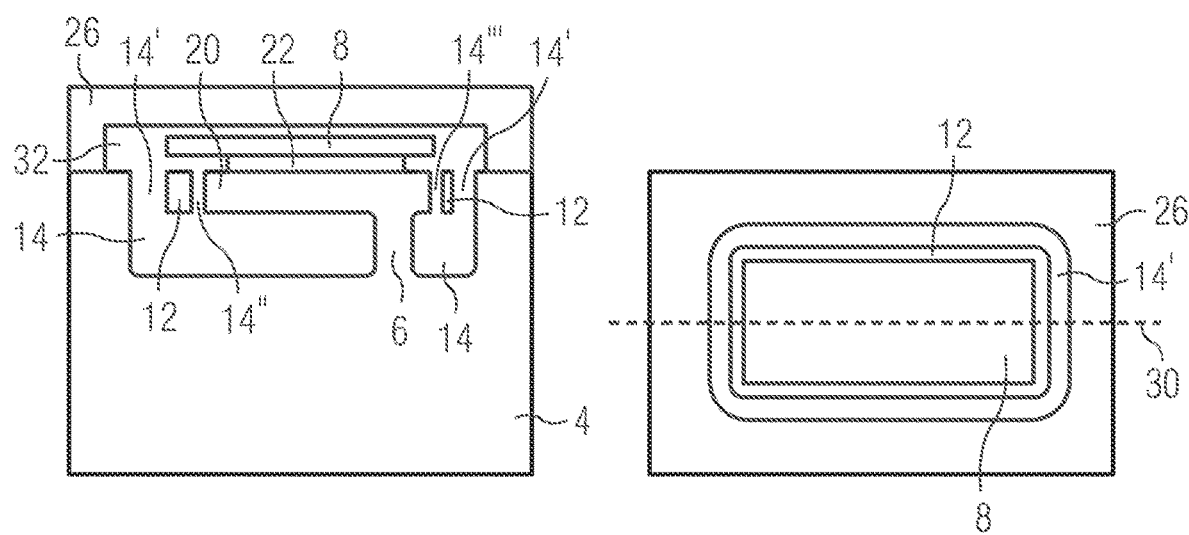

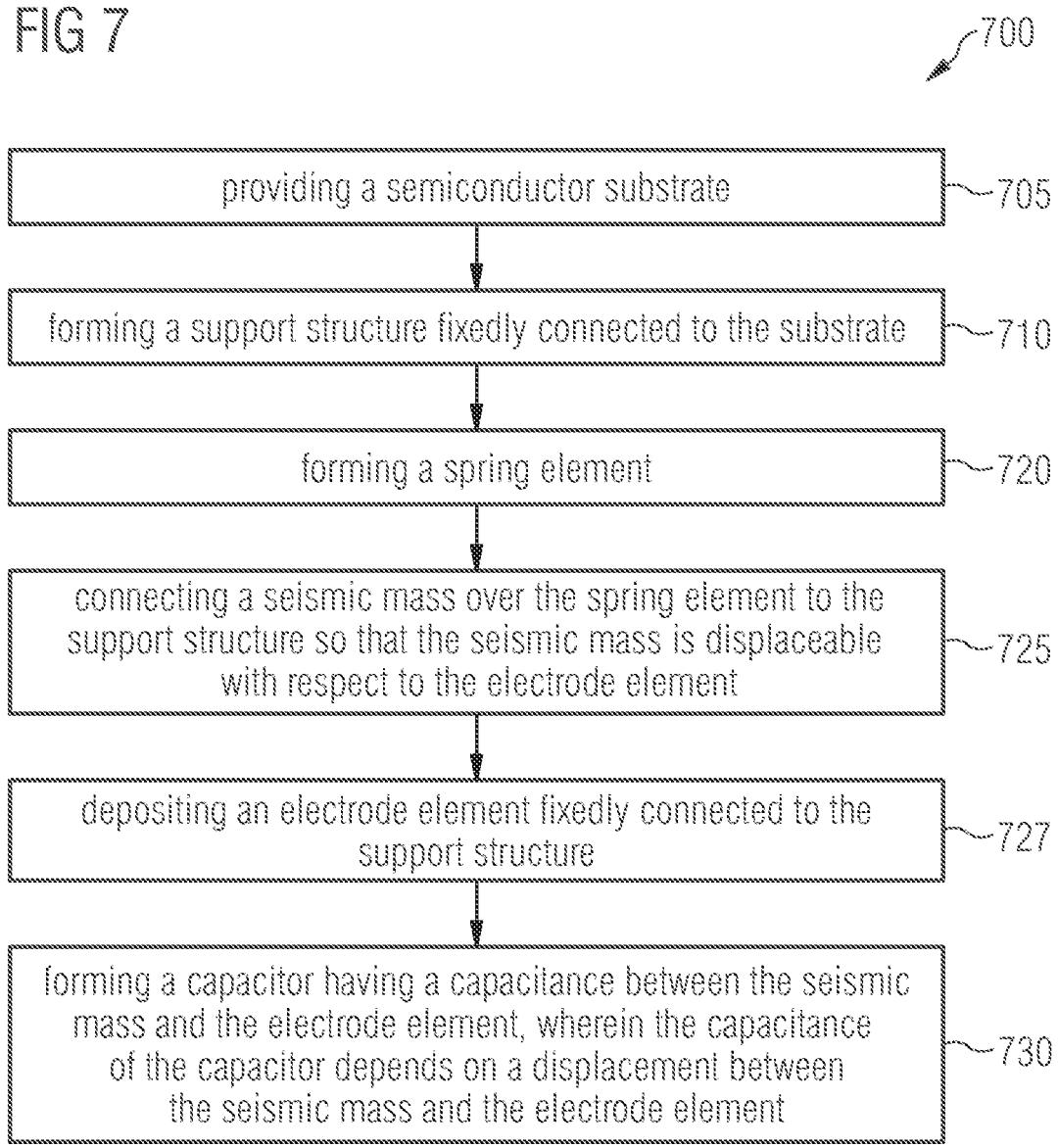

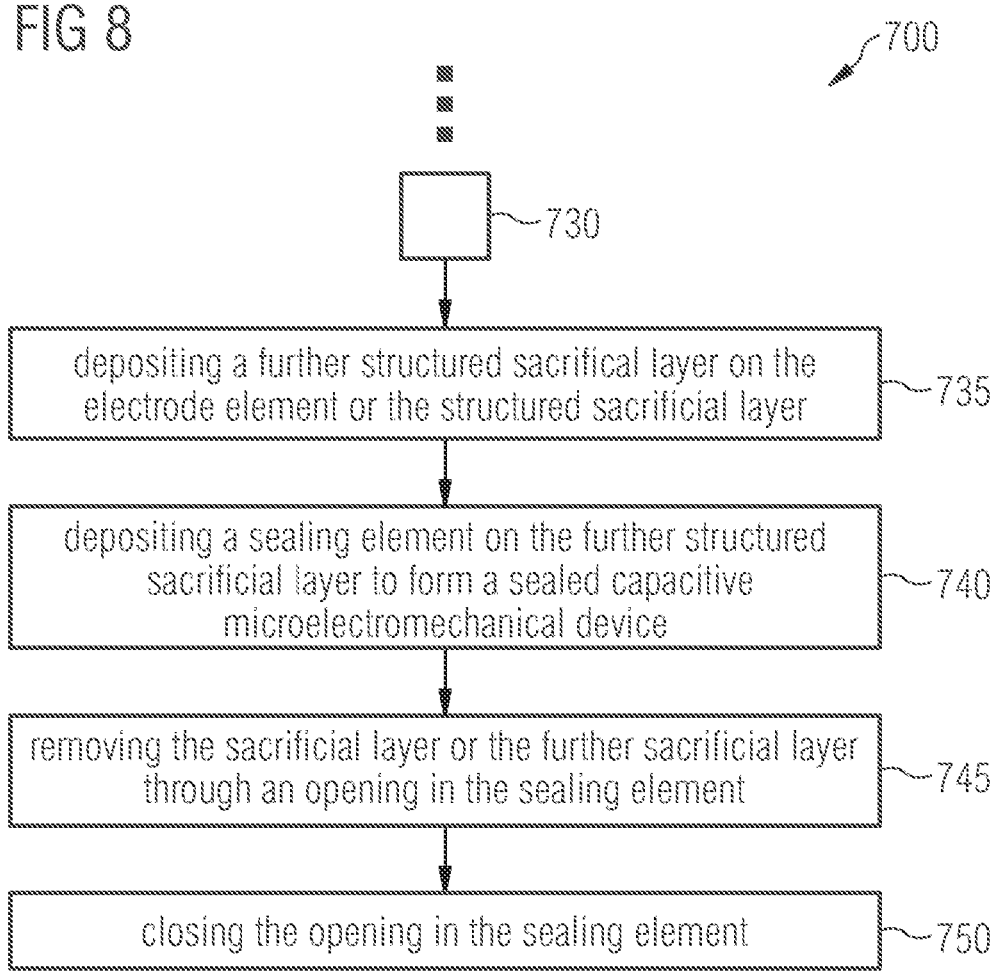

CAPACITIVE MICROELECTROMECHANICAL DEVICE AND METHOD FOR FORMING A CAPACITIVE MICROELECTROMECHANICAL DEVICE

CROSS-REFERENCE TO RELATED APPLICATIONS

This application is a divisional of U.S. patent application Ser. No. 16/860,528 filed Apr. 28, 20202, which is a divisional of U.S. patent application Ser. No. 15/200,299 filed Jul. 1, 2016, now U.S. Pat. No. 10,684,306 issued Jun. 16, 2020, which claims the benefit of German Patent Application No. 10 2015 212 669.2 filed Jul. 7, 2015, which are incorporated by reference as if fully set forth.

FIELD

Embodiments relate to a capacitive microelectromechanical device and a method for forming the capacitive microelectromechanical device. Embodiments show an acceleration sensor or an accelerometer with improved stress decoupling.

BACKGROUND

Acceleration sensors or accelerometers are mass products in automotive and consumer goods electronics. Therefore, example systems are desired that integrate a simple threshold (value) switch or a threshold detector in an Application Specific Integrated Circuit (ASIC). Such a system may be, for example, a Tire Pressure Monitoring System (TPMS)-sensor.

Migrating or converting the systems into new or smaller technology nodes is challenging, since a complexity of the Complementary Metal Oxide Semiconductor (CMOS)-processes shall not be unnecessarily increased and an existing integration scheme of the CMOS circuit shall be maintained with lowest possible developmental efforts.

For technologies using 130 nm process technologies and below, considering, for example, a topology of the frontend-of-line-structures is important. They should not exceed a total thickness of a few hundred nanometers to not influence a typically used boro-phosphate-silicate-glass (BPSG) polishing step. However, accelerometers, for example, are formed with a mounting technology using a thick polycrystalline layer. Furthermore, a reduction to a lowest possible amount of additional steps and a shared use of available or present processes is advantageous for a successful integration.

A further challenge is the interaction of housing and sensor. In capacitive sensors, capacitor elements are, according to the type of housing, exposed to substantial or significant stress. Therefore, special housings are often used, which contribute a considerable cost component of the overall or entire system.

Furthermore, other suggestions exist of how to implement an integrated structure in a substrate. They are either very expensive or difficult to integrate them in a CMOS-process. Moreover, many of today's available capacitive working structures are extremely vulnerable against stress impact from a packet.

Therefore, there is a need for an improved approach.

SUMMARY

Embodiments for forming capacitive microelectromechanical devices are provided.

Embodiments are based on the finding that the (active) elements of the capacitive microelectromechanical device, forming the capacitor of the device, are connected or fixed to a (single) pole or (rigid) suspension. This connection is advantageously the only connection between the elements of the capacitor and the housing. To build such a structure, a silicon-on-nothing structure (SON) structure may be used to form a seismic mass within the semiconductor substrate. The seismic mass is self-supporting and connected to the pole. Furthermore, a counter-electrode is formed opposite to the seismic mass and fixedly connected to the pole. Therefore, the sensor element (or the capacitor) is mostly independent from a stress of the housing or a stress induced by the housing and further undesirable external mechanical influences or impacts. A stress or other mechanical impacts may be induced, for example, due to temperature differences or external forces attacking the housing or having an impact on the housing. Furthermore, such an implementation remains the opportunity to monolithically integrate the sensor with an ASIC. In other words, forming a discrete acceleration sensor, accelerometer, or g-sensor, which is implemented or integrated in the (silicon) substrate is promising. This enables using a monocrystalline structure to form the microelectromechanical device with all related advantages.

Embodiments show a capacitive microelectromechanical device. The device comprises a semiconductor substrate, a support structure, an electrode element, a spring element, and a seismic mass. The support structure, such as e.g. a pole or suspension, is fixedly connected to the substrate, for example a (silicon) semiconductor substrate. Moreover, the electrode element or counter-electrode is fixedly connected to the support structure. Furthermore, the seismic mass is connected over the spring element to the support structure so that the seismic mass is displaceable or movable with respect to the electrode element. Therefore, the seismic mass and the electrode element form a capacitor having a capacitance which depends on a displacement between a seismic mass and the electrode element. The (sole) point of contact between the semiconductor substrate, which may form the housing, and the sensing elements, for example the capacitor formed by the electrode element and the seismic mass, is the support structure. Externally induced stress is therefore only transmitted to the capacitor via the support structure, which is connected to the substrate advantageously only at a small area.

In other words, a volume of the support structure may be at least ten times smaller compared to a volume of the seismic mass. Furthermore, a cross-sectional area of the support structure at a side wall portion between the support structure and the substrate is at least four times smaller compared to a MEMS surface area of the seismic mass. In other words, a connection point of the support structure to the semiconductor substrate extends to an area which may be less or equal to one fourth of a main surface area or an effective size of the seismic mass.

According to further embodiments, the semiconductor substrate comprises a recess. The support structure is therefore fixedly connected to the substrate within the footprint of the recess. Moreover, the support structure, the electrode element, the spring element, and the seismic mass comprise a material of the semiconductor substrate or another conducting material such as polycrystalline silicon. In other words, the capacitive microelectromechanical device may be completely formed from the semiconductor substrate, for example using etching of the semiconductor substrate. The electrode element and the seismic mass may be separated or structured e.g. using a further SON-process. According to a preferred embodiment, at least the support structure, the seismic mass, and the spring element are formed using etching of the semiconductor substrate, wherein the electrode element may be deposited in a further processing step. Therefore, the semiconductor substrate may form a part of the housing having e.g. five of six side walls of the housing at least partially created. To form a complete housing, a sealing element may be arranged and configured to hermetically seal the capacitive microelectromechanical device such that the support structure, the electrode element, and the seismic mass are arranged within the footprint of the substrate and the sealing element. In other words, the sealing element and the substrate may form a hermetically sealed housing of the capacitor.

The method for forming the capacitive microelectromechanical device may comprise a Venezia process to build the seismic mass within the semiconductor substrate or at least to separate a bottom area of the seismic mass from the bottom of the semiconductor substrate, such that the seismic mass may be moved or displaced with respect to the counter-electrode or the electrode element without touching the semiconductor substrate. Furthermore, an all-round trench may completely separate the seismic mass from the semiconductor substrate after the Venezia process was applied. The all-round trench may be etched using conventional etching processes, leaving out a connection from the seismic mass to the spring element. Therefore, the seismic mass is created as a silicon-on-nothing structure.

Before embodiments are described in detail using the accompanying figures, it is to be pointed out that the same or functionally equal elements are given the same reference numbers in the figures and that a repeated description for elements provided with the same reference numbers is omitted. Hence, descriptions provided for elements having the same reference numbers are mutually exchangeable.

BRIEF DESCRIPTION OF THE DRAWING(S)

Embodiments will be discussed subsequently referring to the enclosed drawings, wherein:

FIG. 1 shows a schematic illustration of the capacitive microelectromechanical device;

FIG. 2A shows a schematic cross-sectional view of the capacitive microelectromechanical device in a side view;

FIG. 2B shows a schematic cross-sectional view of the capacitive microelectromechanical device from a top view;

FIG. 2C shows a schematic illustration of a section of the capacitive microelectromechanical device;

FIGS. 4A-4G show a schematic sequence of top view and cross-sectional views of the capacitive microelectromechanical device after relevant processing steps;

FIG. 7 shows a schematic block diagram of a method for forming the capacitive microelectromechanical device; and FIG. 8 illustrates a schematic block diagram of the method of FIG. 7 showing further optional processing steps.

DETAILED DESCRIPTION

Figure 3:
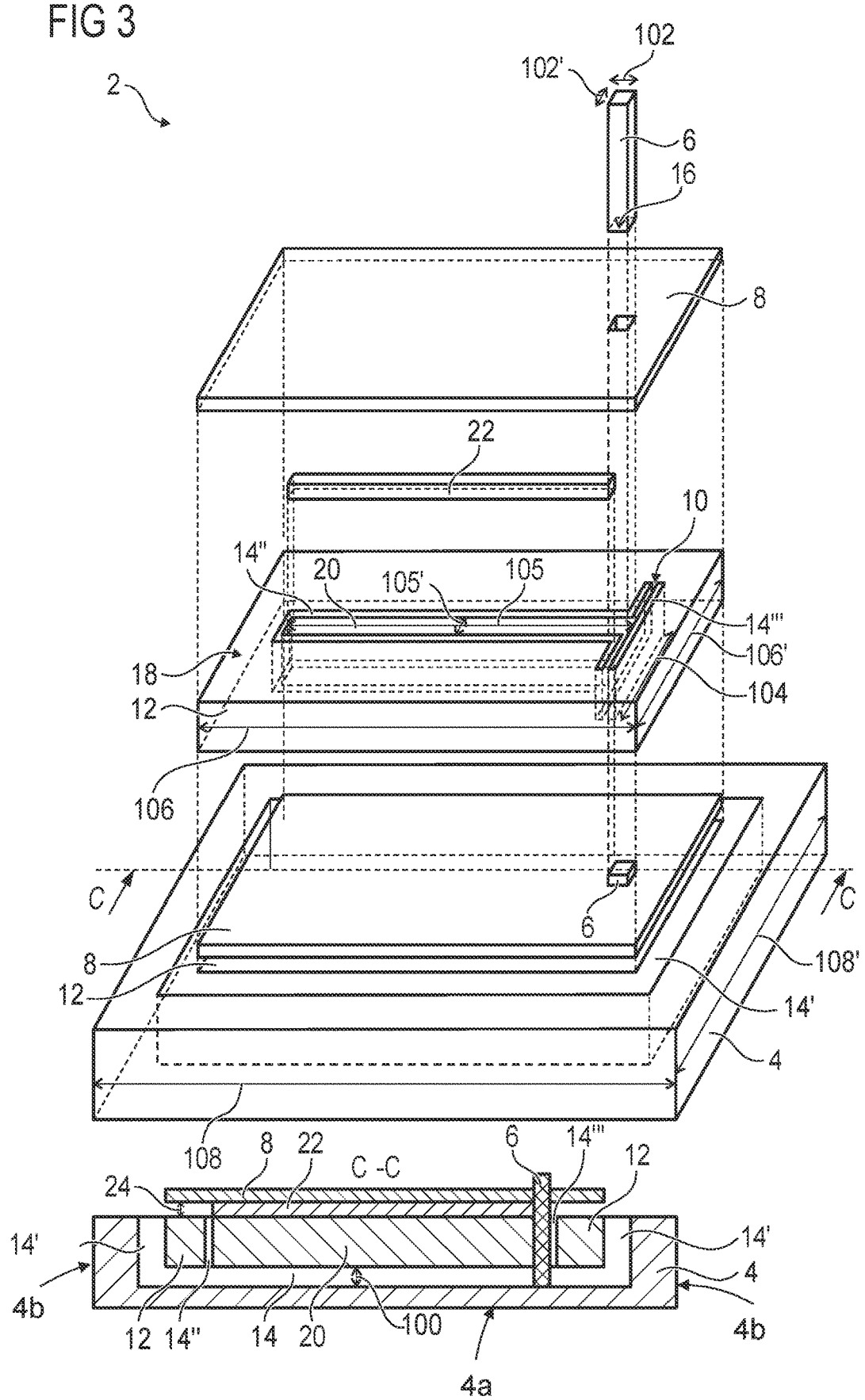
FIG. 3 shows a schematic representation of the capacitive microelectromechanical device according to a further embodiment.

In the following, embodiments will be described in further detail. Elements shown in the respective figures having the same or a similar functionality will have associated therewith the same reference signs.

FIG. 1 shows a schematic illustration of a capacitive microelectromechanical device 2. The capacitive microelectromechanical device 2 comprises a semiconductor substrate 4, a support structure 6, an electrode element 8, a spring element 10, and a seismic mass 12. The support structure 6, for example a pole, suspension, or a post, is fixedly connected to the semiconductor substrate 4, which may comprise silicon. The electrode element 8 is fixedly connected to the support structure 6. Moreover, the seismic mass 12 is connected over the spring element 10 to the support structure 6 so that the seismic mass 12 is displaceable, deflectable, or movable with respect to the electrode element 8. In other words, the size of a gap 24 between the seismic mass 12 and the electrode element may vary, for example, if the capacitive microelectromechanical device 2 is moved or accelerated. A degree of the displacement or the deflection of the seismic mass may depend on a spring constant of the spring element 10. Moreover, the seismic mass and the electrode element form a capacitor having a capacitance which depends on a displacement between the seismic mass and the electrode element. Therefore, a change of capacitance with respect to a certain movement or acceleration may depend on the spring constant of the spring element 10. FIG. 2A shows a schematic illustration of a cross-sectional view of the capacitive microelectromechanical device 2 from a side view. The cross-sectional plane A-A, indicating the cross-section, is shown in FIG. 2B. Accordingly, FIG. 2A shows the cross-sectional plane B-B, where FIG. 2B is derived from. Moreover, box 28 illustrates a section of the microelectromechanical device where FIG. 2C focuses on.

FIG. 2A shows again the semiconductor substrate 4. According to this embodiment, the semiconductor substrate 4 comprises a recess 14, wherein the support structure 6 is fixedly connected to the substrate 4 within the footprint or dimensions of the recess 14. This may be derived, for example, by using a Venezia process to form a recess below the seismic mass 12 and furthermore using (deep trench) etching an all-round or circumferential trench 14' from (a top) of the semiconductor substrate to the recess between the seismic mass and the semiconductor substrate 4. When applying the silicon-on-nothing process, an area between the seismic mass and the semiconductor substrate may be skipped or omitted from being etched, forming the future support structure 6. In other words, the support structure, the electrode element, the spring element, and the seismic mass comprise a material of the semiconductor substrate. According to further embodiments, the support structure, the spring element, the seismic mass, and especially the electrode element may comprise a further conducting material such as for example polycrystalline silicon.

The silicon-on-nothing process may also be referred to as an empty space in silicon (ESS) process. A similar or equal process is the Venetia or Venezia process, which was developed (nearly) at the same time. Both processes may be similar, although they may differ in details. However, the Venezia process and the silicon-on-nothing process are mutually applicable. Based on regular silicon wafers, a plurality of trenches may be formed or opened. The trenches may be oxidized after an epitaxial growth. The etching step may be executed selectively or may be extended to all surfaces of a later chip. Oxidized buried channels and cavities which may be obtained inside the monocrystalline silicon allow for a manufacturing of cheap substrates, for example, silicon on insulator (SOI) substrates. After having formed the trenches, for example, by applying temperatures of, e.g., more than 1000° C., more than 1100° C. or more than 1200° C. and while applying a hydrogen material, the silicon material may recombine such that the cavity is formed inside the semiconductor substrate. The recombination may comprise an epitaxial growth and/or a doping of the material that recombines. A portion of the semiconductor substrate covering the cavity and being arranged between the cavity and the main surface may form the support structure.

According to a further embodiment, an area within the semiconductor substrate 4 surrounded by the recesses or trenches 14 and 14' may be completely etched and the further elements of the microelectromechanical device 2 may be subsequently or in parallel formed within the recess, for example using (material) deposition steps which may be conform with typical semiconductor processing.

To meet a demand that a stress of the housing or the semiconductor substrate 4 shall not, or only to a minor extent, be transferred to the sensing elements forming the capacitor, namely the electrode element and the seismic mass, a size of the support structure shall be comparably small. For example, a volume of the support structure is at least 30 times smaller, or at least 20 times smaller, or at least 10 times smaller compared to a volume of the seismic mass 12. Additionally, or alternatively, a cross-sectional area of the support structure at a side wall portion between the support structure and the semiconductor substrate is at least four times smaller compared to a main surface area of the seismic mass. This will be further described with respect to FIG. 2B.

According to further embodiments, the capacitive microelectromechanical device 2 comprises a further electrode element formed in the seismic mass e.g. using doping. Additionally, or alternatively, the further electrode element may be, for example, deposited on the seismic mass using deposition of a layer structure comprising an electrically conductive material. The further electrode element may form a plate capacitor in connection with the electrode element 8. According to the previous embodiments without further electrode elements, the capacitive microelectromechanical device may work using the principal of capacitive proximity sensors using a single electrode element to detect objects (or even more a distance of objects) in front of the electrode element. Moreover, the electrode element and/or the further electrode element may be electrically connected to the support structure such that a signal indicating a current capacitance of the capacitor or a change of the current capacitance of the capacitor is derivable. In other words, the electrode elements may be electrically connected by the support structure and, a sensor signal may be, for example, provided to a processing unit through the support structure.

According to further embodiments, the microelectromechanical device 2 comprises a sealing element 26 configured to hermetically seal the capacitive microelectromechanical device 2 such that the support structure, the electrode element, and the seismic mass are arranged within the footprint of the substrate of the sealing element. Therefore, the semiconductor substrate 4 and the sealing element 26 may form a housing of the capacitive microelectromechanical device. According to embodiments, the fixture element 6 is mechanically connected to the substrate 4 and the sealing element 26 to form a fixture element with increased stability. In other words, the fixture element 6 may be connected to both, the semiconductor substrate 4 and the sealing element 26. This two point connection is, when compared to a single point connection, connecting the support structure 6 only to the semiconductor substrate 4, improves a stability or a strength of the support structure 6.

FIG. 2B shows a schematic cross-sectional view of the capacitive microelectromechanical device from a top view. The cross-section A-A is shown with respect to FIG. 2A. It is arranged below the sealing and the counter-electrode.

FIG. 2B shows the semiconductor substrate 4 and the seismic mass 12 spaced apart from the semiconductor substrate 4 by the trench 14'. According to embodiments, the seismic mass comprises a reinforcement structure 20 fixedly connected to the support structure 6, configured to reinforce the electrode element (not shown in FIG. 2B) such that the electrode element is arranged in a fixed position with respect to the substrate or the support structure. In other words, the electrode element should be stiff with respect to the whole capacitive microelectromechanical device, such that only the seismic mass 12 is deflected or deviated if the whole capacitive microelectromechanical device moves or is accelerated, such that a defined (residual or differential) capacitive signal may be obtained. Therefore, the counter-electrode or the electrode element may comprise a material having the desired or necessary stiffness, or the electrode element may be reinforced using a reinforcement structure 20 such that a stiffness of the electrode element is increased to not touch the seismic mass during normal operation and/or to obtain a defined sensor signal.

According to further embodiments, the reinforcement structure may be higher than or extended over the main surface area of the seismic mass 18 such that there is a gap 24 (not shown) between the seismic mass 12 and the electrode element. Moreover, a further embodiment shows the seismic mass 12 being structured such that the residual of the structuring forms the reinforcement structure 20. The structuring may be performed by etching or forming the trench 14" separating the reinforcement structure from the seismic mass. Furthermore, the reinforcement structure may comprise a spacer element 22 to form a gap between the electrode element and the seismic mass 12 such that the capacitor is formed by the electrode element and the seismic mass. In other words, if the seismic mass and the reinforcement structure comprise a same or nearly similar height, a spacing element may be applied such that the electrode element is still reinforced by the reinforcement structure and furthermore, does not touch or comprises a gap between the electrode element and the seismic mass. Moreover, the spacer element may form a dielectric isolation between the electrode element and the reinforcement structure, such that the spacer element 22 is configured to prevent charge carriers from moving from the electrode element to the reinforcement structure. Charge carriers moving from the electrode element to the seismic mass would "discharge" the capacitor and therefore reduce or even wipe out or eliminate the capacitive sensor signal.

According to a further embodiment, the spring element 10 may be formed using a part of the trench 14" used to form the reinforcement structure and/or a further trench 14''', such that the seismic mass 12 is movable or deployable or displaceable with respect to the support structure 6 and therefore to (all of) the remaining parts of the capacitive microelectromechanical device 2.

As already described by respective FIG. 2A, it is advantageous to have a small support structure 6 compared to the seismic mass, if a stress or external impact on the capacitive microelectromechanical device shall be kept away from the capacitor or sensing elements of the microelectromechanical device. Therefore, it may be important that a cross-sectional area 16 of the support structure 6 at a side wall portion between the support structure and the substrate 4 is at least four times smaller or at least ten times smaller or at least 20 times smaller compared to a main surface area 18 of the seismic mass 12. Even though the cross-sectional area 16 shown in FIG. 2B is not shown at a side wall portion between the support structure and the substrate, it may comprise the same size as the side wall portion of the semiconductor substrate 4 if the support structure 6 is assumed to be a cuboid or comprising only edges with perpendicular orientation.

FIG. 2C shows a section 28 of the capacitive microelectromechanical device 2. The section 28 is shown with respect to FIG. 2A. The section 28 focuses on an edge of the capacitive microelectromechanical sensor which is formed or arranged according to an embodiment.

Again, it is shown that the semiconductor substrate 4 and the seismic mass 12 are separated by a trench 14'. The seismic mass 12 may be bulk silicon from a silicon-on-nothing process wherein, in other words, the seismic mass is a silicon-on-nothing structure. Moreover, the counter-electrode or electrode element 8 is spaced apart from the seismic mass 12 by a gap 24. Furthermore, the sealing 26 is shown being arranged with a gap 24' to the counter-electrode and/or hermetically sealing the capacitive microelectromechanical device in connection with the semiconductor substrate 4. In other words, the semiconductor substrate 4 and the sealing 26 form a hermetically sealed housing of the capacitive microelectromechanical device 2. The sealing 26 is spaced apart from the counter-electrode 8 by a gap 24', which may have a size of a couple of 10 nanometers to a few micrometers, for example 100 nm, 500 nm, 1 µm, or 3 µm. Such a gap is sufficient such that the counter-electrode and the sealing do not touch, since the counter-electrode is comparatively stiff as already explained.

The proposed embodiments integrate an accelerometer structure, an acceleration sensor structure, or a g-sensor structure in a semiconductor substrate to measure an acceleration e.g. in z-direction, which may be perpendicular to a main surface area of the semiconductor substrate or the main surface area 18 of the seismic mass. Therefore, a silicon-on-nothing technology may be used. An electrode structure on top of the substrate may be used to derive a capacitive measurement signal.

Even though, the element being sensitive to acceleration (e.g. the seismic mass) as well as the electrode to derive the measurement signal are located or hung up at a common point, comprising a size of less than 10 µm times 10 µm for example. Thus, seismic elements having an extension of, for example, 100 µm times 100 µm or more are possible or achievable, without having or generating an increased interaction with the housing. The geometry of the suspension or support structure enables a more or less unrestricted design of the spring elements and the seismic mass.

A major use may be for example the simple and easy integration into a CMOS process. On the other hand, embodiments show an effective decoupling from an external stress or further external impacts and therefore enables using cheaper or lower priced housings.

FIG. 3 shows a schematic illustration of the capacitive microelectromechanical device 2 in a combined exploded and collapsed (assembled) view and a cross-sectional view at the bottom of FIG. 3 according to an embodiment similar to the embodiment shown with respect to FIGS. 2A and 2B. The combined exploded and collapsed view is a perspective view in which the support structure 6, the electrode element 8, the seismic mass 12, and the spacer element 22, for example, are shown both in suspension above the semiconductor substrate 4, and in their final assembled position to form the capacitive microelectromechanical device 2 through which cross-sectional plane C-C intersects. The exploded portion of the figure is intended to show more clearly the order of arranged parts before being finally assembled in the collapsed portion of the figure. However, the sealing is not shown in FIG. 3 for convenience, since it is on the one hand optional for the capacitive microelectromechanical device and it would overload the Figure. Moreover, FIG. 3 shall be used to exemplarily show a couple of sizes or dimensions of features or elements of the capacitive microelectromechanical device 2.

Therefore, a size of the recess 14, or a gap between the bottom of the semiconductor substrate 4 and the bottom of the seismic mass 12 or the support structure 20, for example, a size 100 of a gap may be between 100 nm and a few µm, for example 500 nm, typically 1 µm, or 3 µm. Furthermore, an edge length 102, 102' (or a diameter if the support structure is round or oval or not angular) of the support structure 6 may be between 1 µm to several µm such as for example 5 µm, 10 µm, or 20 µm. Moreover, the support structure 6 may be square or rectangular, where the length of the edge 102 may be different from the length of the edge 102'. Moreover, the size of the support structure may be defined by the lithography of, for example, the silicon-on-nothing etching process. However, other forms of the support structure 6 are further possible, such as, for example rectangular, circular or oval forms. Moreover, even trapezoid or cone forms of the support structure 6 are possible. Therefore, the size 200 and 200' may refer to a medium, average, or effective size or diameter of the support structure 6.

The spring 10 may be formed using etching trenches 14''' and 14'', which may not necessarily form the reinforcement structure 20. A length 104 of the spring may be several 10 µm, such as for example 20 µm, 50 µm, or 100 µm. A width of the spring element 10, which may be measured perpendicular to the length 104 e.g. being a difference between the trench 14''' and the trench 14'' (at the lowest extent of the size or gap) may be between several 100 nm to several µm, for example, 250 nm, 700 nm, or 5 µm, typically 1 µm. It has to be noted that the design or form of the spring element 10 is only exemplary and that any further embodiments may be thought of using different forms of spring elements, which enable the seismic mass to move with respect to the electrode element 8.

The reinforcement structure 20 may have a size 105, 105' of several µm to several ten µm, for example 5 µm, 15 µm or 50 µm. However, as shown with respect to FIG. 3, the sizes 105 and 105' may be different, even though according to further embodiments, the sizes 105 and 105' may be (more or less) equal, such that the reinforcement structure 20 forms a square.

Moreover, the seismic mass 12 may comprise of sizes 106 and 106' that are between several 10 µm to several 100 µm, for example 50 µm, 150 µm, or 250 µm. Again, sizes 106 and 106' may be different or equal such that the seismic mass is rectangular, square, oval, or circular.

According to embodiments, an overall size 108, 108' of the capacitive microelectromechanical device 2 may be between 50 μm to several 100 μm, such as, for example, 75 μm, 200 μm, or 400 μm.

FIGS. 4A-4G show an intermediate capacitive microelectromechanical device after (relevant) steps of a fabrication process of the capacitive microelectromechanical device. On the left of each of FIGS. 4A-4G, a cross-sectional view of the intermediate microelectromechanical device is shown at a cross-sectional plane indicated by a dashed line 30. On the right of each of FIGS. 4A-4G, a top view having partly semitransparent surfaces is shown.

Figure 4A:
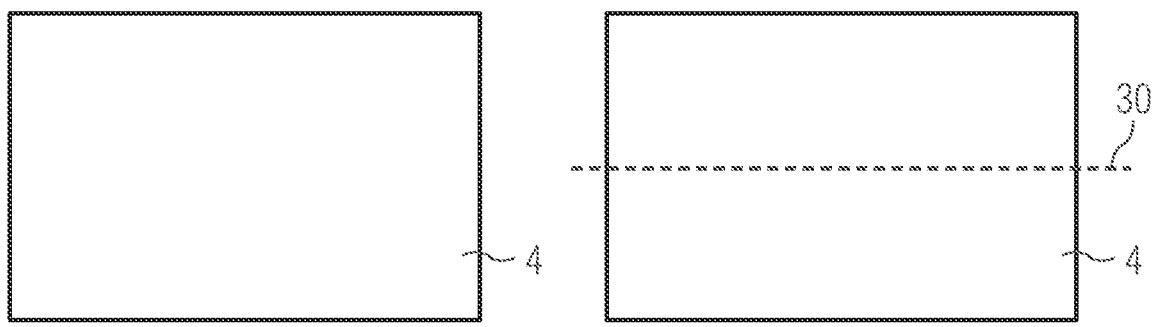

FIG. 4A shows a plane block or wafer of the semiconductor substrate, for example comprising silicon. So far, no structural processing steps were performed, even though the semiconductor substrate may already comprise an (evaluation) circuit.

Figure 4B:
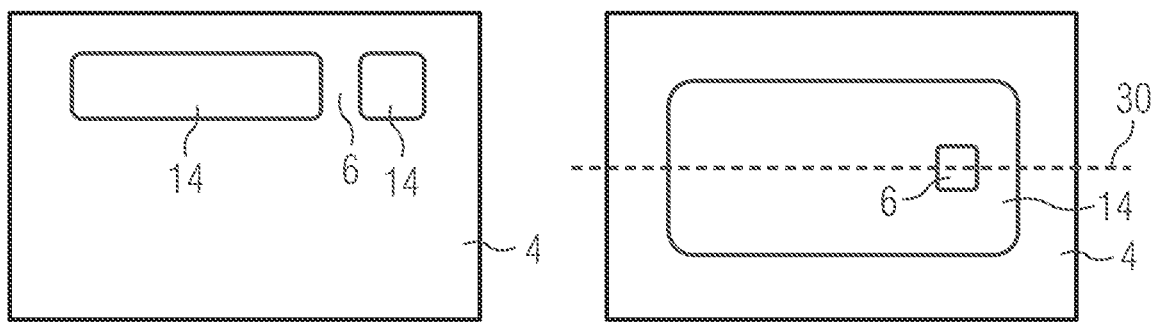

FIG. 4B shows the intermediate capacitive microelectromechanical device after forming a cavity or the recess 14, for example using a silicon-on-nothing processing or a Venezia process. The (remaining) pile in the middle of the recess 14 on the left-hand side of FIG. 4B forms the later support point or support structure 6 of the capacitive microelectromechanical device. On the right-hand side of FIG. 4, the cavity or the recess 14 and the future support structure 6 are indicated for clarification, even though they are not identifiable from above. Hence, the surface of the semiconductor substrate may be shown semitransparent.

Figure 4C:
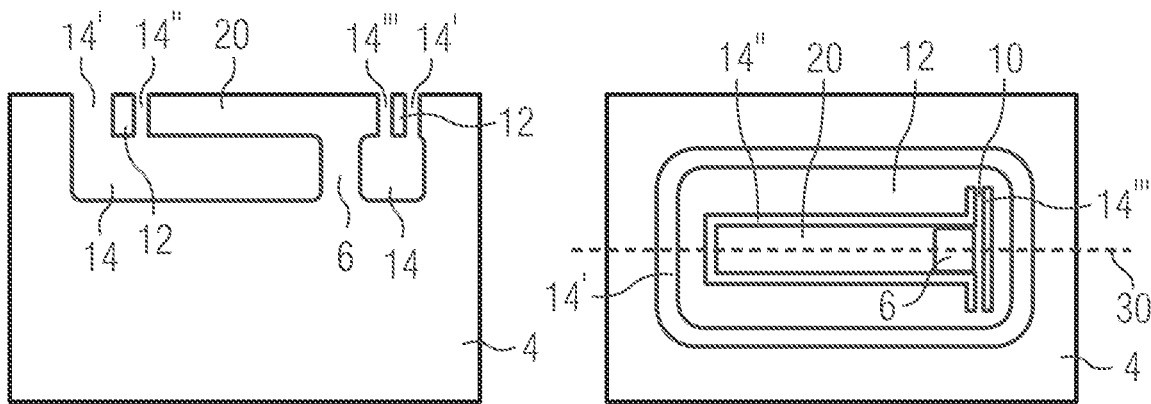

FIG. 4C shows the intermediate capacitive microelectromechanical device after structuring the seismic mass 12, the spring (element) 10, and the reinforcement structure 20 which may be a centered stiff support. The seismic mass is formed using, for example, deep trench etching of the trench 14', wherein the reinforcement structure 20 may be structured using for example (deep trench) etching the trench 14". The spring 10 may be formed, for example by a part of the trench 14" or by a separate trench, for example perpendicular allocated to the spring 10. A second part of the spring 10 may be formed using the trench 14''' or, if the support structure is moved to an edge of the seismic mass, by the trench 14' and the part being parallel to the trench 14' of the trench 14".

FIGS. 4D and 4E show the intermediate capacitive microelectromechanical device after forming structures or layers above the semiconductor substrate 4. It is noted that FIGS. 4D and 4E show the intermediate capacitive microelectromechanical device in the same processing stage differing only in the location of the cross-sectional plane 30 where the intermediate capacitive microelectromechanical device is cut to illustrate the side view of the cross-section on the left-hand side of FIGS. 4D and 4E.

Forming the structures above the semiconductor substrate may comprise the following processing steps. It may be deposited a sacrificial layer 32' above the semiconductor substrate having a size perpendicular to the main surface area 18 of the seismic mass, comprising a size or a height of the gap 24 between the electrode element 8 and the seismic mass 12. The sacrificial layer 32 may comprise carbon or a further suitable material for a sacrificial layer. The sacrificial layer 32 may be structured in the center and at the border of the sacrificial layer. In the structured center of the sacrificial layer 32' the spacer element 22 may be deposited. The spacer element 22 may comprise a silicon oxide, for example silicon dioxide or a further isolating material, which may form a dielectric isolation between the electrode element 8 and the reinforcement structure 20. Furthermore, the electrode element 8 may be deposited upon or above the spacer 22 and the sacrificial layer 32'. The electrode element 8 may be structured such that it covers the surface area 18 of the seismic mass to a large extent or even completely. Moreover, the electrode element 8 may comprise a conducting material such as polycrystalline silicon. Furthermore, a second sacrificial layer 32" or a further part of the sacrificial layer may be deposited above the sacrificial layer 32' and the electrode element 8. The further sacrificial layer may be structured (as well as the sacrificial layer 32') at a boundary of the sacrificial layer. In the structured area at the boundaries of the sacrificial layers 32' and 32", which may now form a common sacrificial layer 32, and/or above the common sacrificial layer 32, the sealing element 26 is deposited. The sealing element 26, for example a covering layer, may comprise the same material as the spacer element 22 such as, for example, silicon dioxide.

Figure 4F:
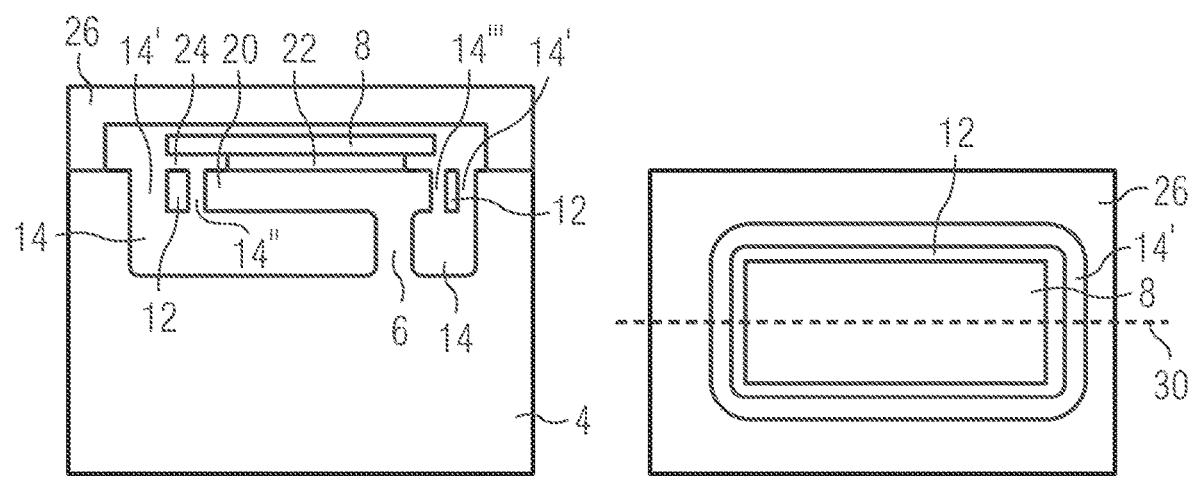
Figure 4G:
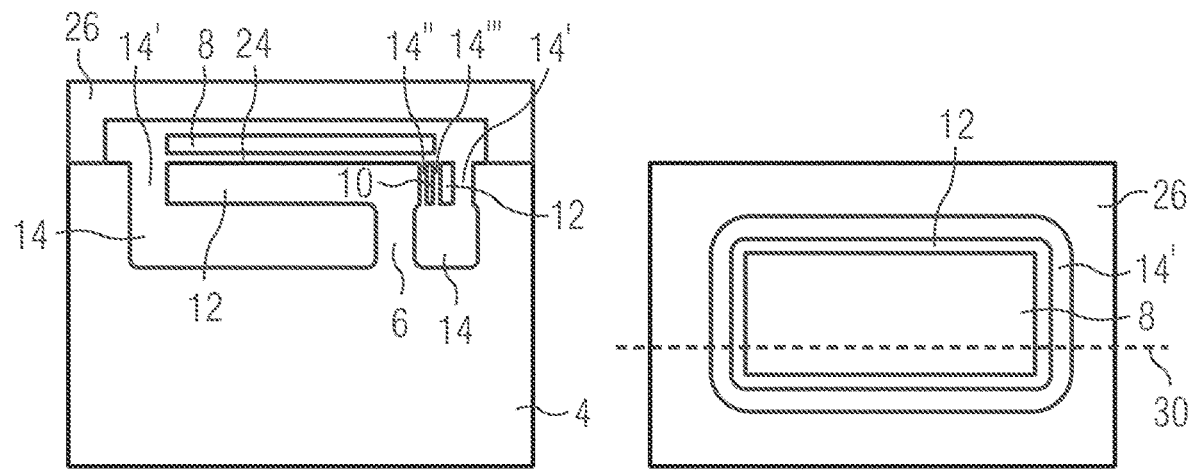

FIGS. 4F and 4G show the (final) capacitive microelectromechanical device 2. Again, as already seen with respect to FIGS. 4D and 4E, FIGS. 4F and 4G depict the same device at different cross-sectional planes 30. To derive the capacitive microelectromechanical device from the previous FIGS. 4D and 4E, the sacrificial layer 32 should be removed. For removing the sacrificial layer 32, one or more holes may be applied in the sealing element 26 to apply the removing process to the sacrificial layer. The sacrificial layer may be removed using, for example, a dry ashing process such as, for example (oxygen) plasma ashing or a further removing process suitable to remove the chosen sacrificial layer 32. Furthermore, the one or more holes need to be closed to derive the (final) capacitive microelectromechanical device shown with respect to FIGS. 4F and 4G.

Figure 5:
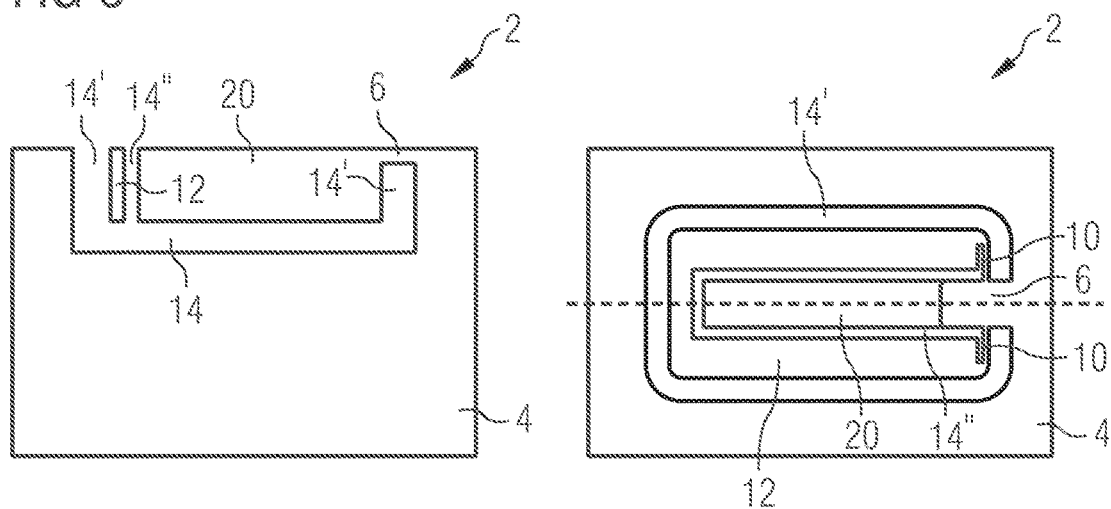
FIG. 5 shows a schematic representation of the capacitive microelectromechanical device according to a further embodiment with a different structure of the support structure and the spring element.

FIG. 5 shows the capacitive microelectromechanical device according to a further embodiment with a different structure of the support structure 6 and the spring element 10. According to this embodiment, the support structure 6 is arranged at a side wall portion of the semiconductor substrate 4. Furthermore, the spring 10 is formed using the trenches 14' and 14". Forming a trench 14''' is not necessary, since the trench 14" ends up close to the border of the seismic mass 12. Compared to the previous embodiments, the support structure 6 is not located at the bottom area portion of the semiconductor substrate 4.

Figure 6A:
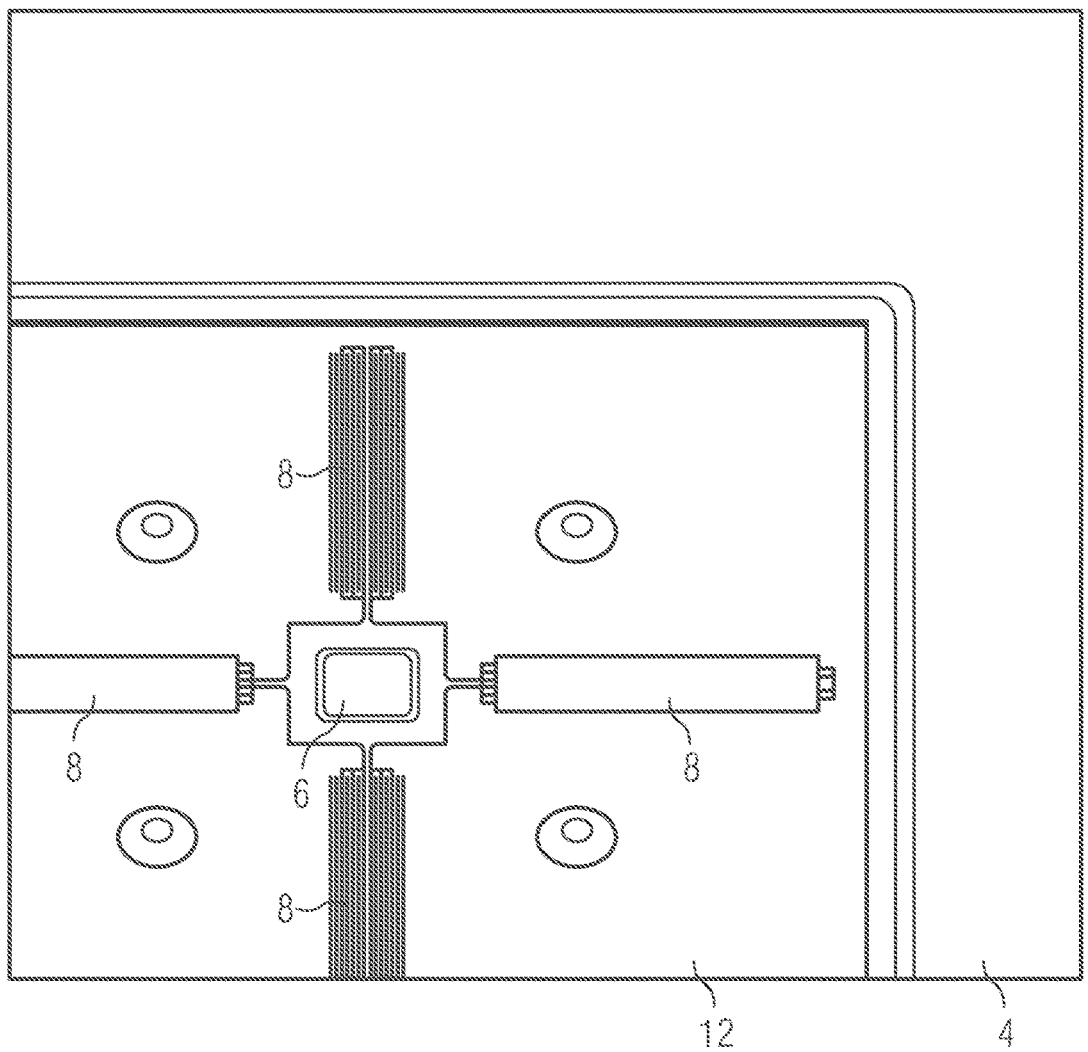
FIG. 6A shows a schematic illustration of a silicon-on-nothing structure with back-mounted substrate fixation.
Figure 6B:
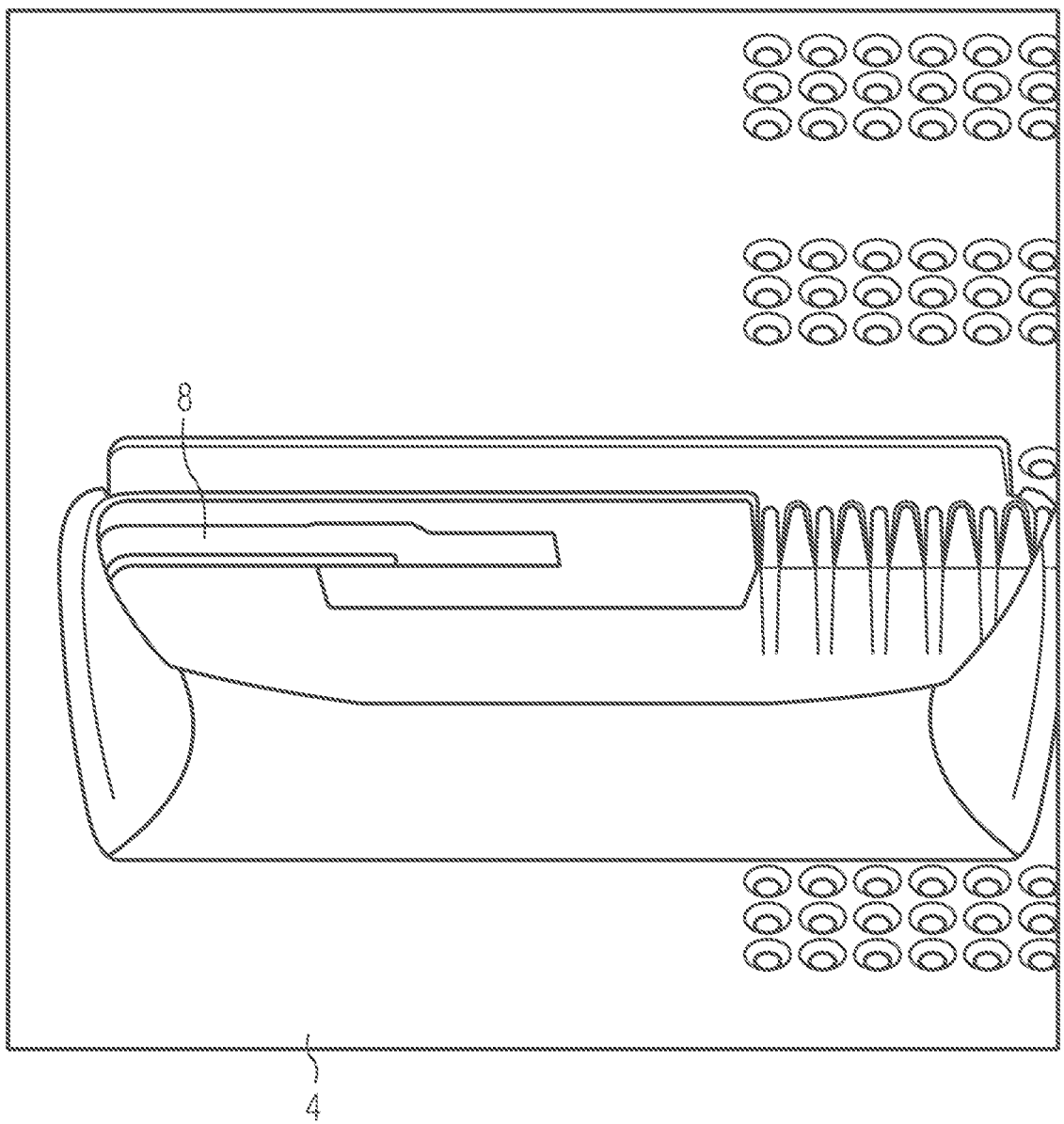
FIG. 6B shows a schematic FIB cut (FIB: focused ion beam) through a cavity structure with high precision geometry.
Figure 6C:
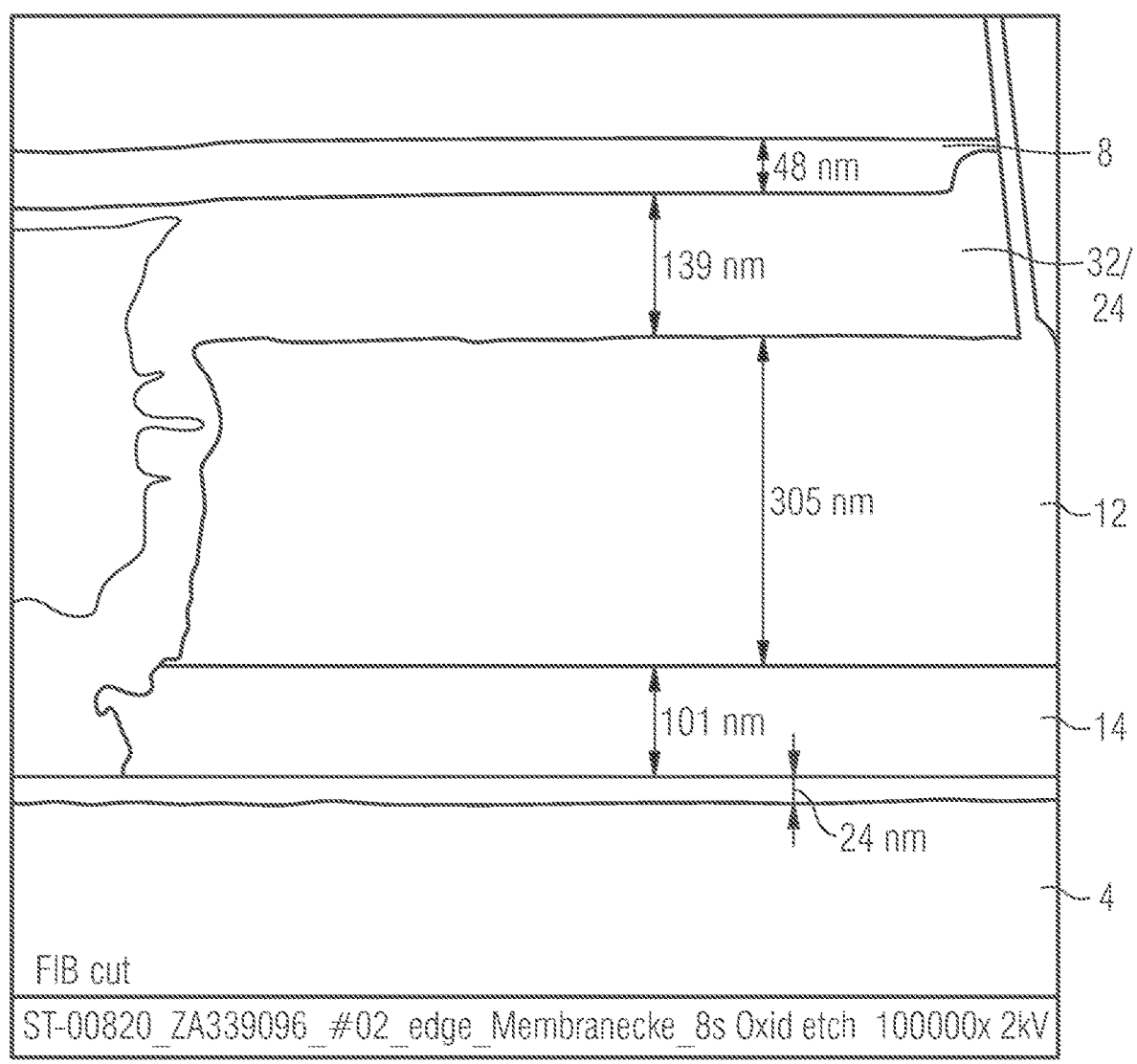
FIG. 6C shows a close-up of a cavity structure formed using a carbon-sacrificial layer process.

FIGS. 6A-6C show the relevant structuring processes each of which itself is tested and available. FIG. 6A shows a schematic illustration of a scanning electron microscope measurement of a silicon-on-nothing structure, such as the seismic mass 12 being fixed or attached to the substrate 4 at a central point, for example the support structure 6. Electrode and sealing structures with intermediate cavities may be created using (tested) carbon-sacrificial layer process. FIG. 6B and FIG. 6C schematically illustrate structures using such a carbon-sacrificial layer process. Therefore, FIG. 6B shows a focused ion beam cut through the cavity structure, wherein FIG. 6C shows a close-up of a cavity structure formed using the carbon-sacrificial layer process. Values within FIGS. 6A and 6C are only for illustrative purposes and do not limit the scope of the embodiments.

The landing points or hold point of the electrode on the mechanically stiff reinforcement structure may be easily defined using a lithography process during structuring the carbon-sacrificial layer. This technique may be used as well to form a "table structure" for pressure sensors.

The reinforcement structure of the electrode element may further comprise a variety of forms. According to a further embodiment, the electrode element may have a fishbone structure, where arms are (for example perpendicular) connected to the reinforcement structure. The support structure may only comprise a punctual fix point at the substrate and optionally at the sealing element. The electrical connection may be further applied using the support structure.

According to embodiments, the capacitive microelectromechanical device is a torsional vibrator or torsional oscillator. The torsional vibrator may use a single point suspension. Furthermore, the seismic mass may be a flexibly mounted or elastically suspended inert mass.

FIG. 7 shows a schematic block diagram of a method 700 of forming a capacitive microelectromechanical device. The method 700 comprises a step 705 of providing a semiconductor substrate, a step 710 of forming a support structure fixedly connected to the substrate, a step 720 of forming a spring element, a step 725 of connecting a seismic mass over the spring element to the support structure so that the seismic mass is displaceable with respect to the electrode element, a step 727 of depositing an electrode element fixedly connected to the support structure, and a step 730 of forming a capacitor having a capacitance between the seismic mass and the electrode element, wherein the capacitance of the capacitor depends on a displacement between the seismic mass and the electrode element.

The steps 710 and 725 may be performed using etching a recess into the semiconductor substrate such that the support structure and the seismic mass are formed within a footprint of the recess by omitting the support structure and the seismic mass from being etched. Therefore, it may be used a silicon-on-nothing or a Venezia process to etch the recess into the semiconductor substrate.

To perform the step 730, a structured sacrificial layer may be deposited on the seismic mass, e.g. to form a (future) gap between the electrode element and the seismic mass. Therefore, the electrode element may be deposited on the structured sacrificial layer. The structured sacrificial layer may be deposited as a structured layer or it may be structured after a planar deposition.

FIG. 8 illustrates a schematic block diagram of the method 700 showing further optional processing steps which may be applied after the step 730 has been performed. According to an embodiment, a further structured sacrificial layer is deposited on the electrode element or the structured sacrificial layer in an optional step 735. In a further optional step 740, a sealing element may be deposited on the further structured sacrificial layer to form a sealed capacitive microelectromechanical device. In an optional step 745, the sacrificial layer or the further sacrificial layer may be removed through an opening in the sealing element. Therefore, it may be formed an opening in the sealing element for applying a removing process through the hole to remove the sacrificial layer. Moreover, in a further optional step 750, the opening in the sealing element is closed.

According to further embodiments, technology nodes of 130 nm and below are used to form the microelectromechanical device. For technologies using 130 nm process technologies and below, considering for example a topology of the frontend-of-line-structures is important. They do not exceed a total thickness of a few hundred nanometers to not influence a typically used BPSG (boro-phosphate-silicate-glass) polishing step. Therefore, the microelectromechanical device such as an accelerometer is not formed with a mounting technology using a thick polycrystalline layer.

Moreover, the microelectromechanical device such as a capacitive sensor, capacitor elements are not exposed to substantial or significant stress, independently from the type of housing. Therefore, a special housing is not necessary or required, which would contribute a considerable cost component of the overall or entire system.

Discrete accelerometer structures or acceleration sensor structures, operating on a polycrystalline silicon lamella, may be created on the substrate or in the substrate. Herein, layers comprising a typical thickness of about 5 μm to 10 μm are not used. Therefore, they do not form a basis of a discrete component or structural limit to enable an integration into CMOS processes.

ADDITIONAL EMBODIMENTS ARE PROVIDED BELOW

1. Capacitive microelectromechanical device (2) comprising: a semiconductor substrate (4); a support structure (6) fixedly connected to the semiconductor substrate (4); an electrode element (8) fixedly connected to the support structure (6); a spring element (10); a seismic mass (12) connected over the spring element (10) to the support structure (6) so that the seismic mass (12) is displaceable with respect to the electrode element (8); wherein the seismic mass and the electrode element form a capacitor having a capacitance which depends on a displacement between the seismic mass and the electrode element.
2. Capacitive microelectromechanical device (2) according to embodiment 1, wherein the semiconductor substrate (4) comprises a recess (14), wherein the support structure (6) is fixedly connected to the substrate within the footprint of the recess.
3. Capacitive microelectromechanical device (2) according to any of the preceding embodiments, wherein the support structure (6), the electrode element (8), the spring element (10), and the seismic mass (12) comprise a material of the semiconductor substrate or a further conducting material.
4. Capacitive microelectromechanical device (2) according to any of the preceding embodiments, wherein a volume of the support structure (6) is at least 10 times smaller compared to a volume of the seismic mass (12).
5. Capacitive microelectromechanical device (2) according to any of the preceding embodiments, wherein a cross-sectional area of the support structure at a side wall portion between the support structure (6) and the substrate (4) is at least 4 times smaller compared to a main surface area (18) of the seismic mass.
6. Capacitive microelectromechanical device (2) according to any of the preceding embodiments, further comprising: a reinforcement structure (20) fixedly connected to the support structure (6), configured to reinforce the electrode element (8) such that the electrode element is arranged in a fixed position with respect to the substrate (4) or the support structure (6).
7. Capacitive microelectromechanical device (2) according to any of the preceding embodiments, wherein the seismic mass (12) is structured such that the residual of the structuring forms the reinforcement structure (20), wherein the reinforcement structure comprises a spacer element (22) to form a gap (24) between the electrode element (8) and the seismic mass (12) such that the capacitor is formed by the electrode element and the seismic mass.
8. Capacitive microelectromechanical device (2) according to embodiment 7, wherein the spacer element (22) is configured to form a dielectric isolation between the electrode element and the reinforcement structure, such that the spacer element is configured to prevent charge carriers from moving from the electrode element (8) to the reinforcement structure (20).

9. Capacitive microelectromechanical device (2) according to any of the preceding embodiments, wherein a further electrode element is formed in the seismic mass using doping or on the seismic mass using deposition of a layer structure comprising an electrically conductive material.

10. Capacitive microelectromechanical device (2) according to any of the preceding embodiments, wherein the electrode element or a further electrode element is electrically connected to the support structure, such that a signal indicating a current capacitance of the capacitor or a charge of the current capacitance of the capacitor is derivable.

11. Capacitive microelectromechanical device (2) according to any of the preceding embodiments, further comprising: a sealing element (26) configured to hermetically seal the capacitive microelectromechanical device (2) such that the support structure (6), the electrode element (8), and the seismic mass (12) are arranged within the footprint of the substrate and the sealing element.

12. Capacitive microelectromechanical device according to embodiment 11, wherein the support structure (6) is mechanically connected to the substrate (4) and the sealing element (26) to form a support structure (6) with increased stability.

13. Capacitive microelectromechanical device (2) according to any of the preceding embodiments, wherein the support structure (6) is mechanically connected to the bottom of the recess (14).

14. Capacitive microelectromechanical device (2) according to any of the preceding embodiments, wherein the semiconductor substrate comprises a silicon-on-nothing structure.

15. Method (700) for forming a capacitive microelectromechanical device (2), the method (700) comprising: providing a semiconductor substrate (4); forming a support structure (6) fixedly connected to the substrate (4); depositing an electrode element (8) fixedly connected to the support structure (6); forming a spring element (10); connecting a seismic mass (12) over the spring element (10) to the support structure (6) so that the seismic mass is displaceable with respect to the electrode element; and forming a capacitor having a capacitance between the seismic mass (12) and the electrode element (8), wherein the capacitance of the capacitor depends on a displacement between the seismic mass and the electrode element.

16. Method (700) according to embodiment 15, the method further comprising: etching a recess (14) into the semiconductor substrate (4) such that the support structure (6) and the seismic mass (12) are formed within a footprint of the recess by omitting the support structure and the seismic mass from being etched.

17. Method (700) according to embodiment 16, the method further comprising: using a silicon-on-nothing or a Venezia process to etch the recess (14) into the semiconductor substrate.

18. Method (700) according to any of embodiments 15 to 17, the method comprising: depositing a structured sacrificial layer (32') on the seismic mass (12); and depositing the electrode element (8) on the structured sacrificial layer (32').

19. Method (700) according to any of embodiments 15 to 18, the method comprising: depositing a further structured sacrificial layer (32") on the electrode element (8) or the structured sacrificial layer (32'); depositing a sealing element (26) on the further structured sacrificial layer (32") to form a sealed capacitive microelectromechanical device; removing the sacrificial layer (32') or the further sacrificial layer (32") through an opening in the sealing element (26); and closing the opening in the sealing element.

20. Method according to embodiment 19, the method further comprising a step of forming an opening in the sealing element for applying a removing process through the hole to remove the sacrificial layer.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A capacitive microelectromechanical device, comprising:
a semiconductor substrate comprising a base portion and sidewall portions that extend from the base portion, wherein a recess is defined by the base portion and the sidewall portions;
a support structure arranged within the recess, wherein the support structure is fixedly connected to the base portion of the semiconductor substrate and a longest dimension of the support structure extends from the base portion in a direction parallel with the sidewall portions;
an electrode element fixedly connected directly to the support structure, wherein the electrode element is a plate having a thickness dimension that extends in the direction parallel to the sidewall portions, wherein the support structure extends from the base portion through the electrode element along the thickness dimension;
a spring element arranged within the recess and connected to the support structure;
a seismic mass arranged within the recess and connected to the support structure by the spring element so that the seismic mass is displaceable with respect to the electrode element in the direction parallel to the sidewall portions; and
wherein the seismic mass and the electrode element form a capacitor having a capacitance which depends on a displacement between the seismic mass and the electrode element, the displacement being measured in the direction parallel to the sidewall portions.

2. The capacitive microelectromechanical device according to claim 1, wherein the electrode element has an opening formed through the thickness dimension of the electrode element, the opening being configured to receive the support structure, wherein the support structure is inserted through the opening.

3. The capacitive microelectromechanical device according to claim 2, further comprising:
a sealing element arranged over the recess and coupled to the sidewall portions of the semiconductor substrate and configured to hermetically seal the recess such that the support structure, the electrode element, and the seismic mass are arranged within a footprint of the hermetically sealed recess,
wherein the support structure extends through the thickness dimension of the electrode element via the opening and extends to the sealing element to which the support structure is fixedly coupled.

4. The capacitive microelectromechanical device according to claim 1, wherein the support structure extends through the electrode element and protrudes from a surface of the electrode element that is outwardly facing from the base portion.

5. The capacitive microelectromechanical device according to claim 4, further comprising:
a sealing element arranged over the recess and coupled to the sidewall portions of the semiconductor substrate and configured to hermetically seal the recess such that the support structure, the electrode element, and the seismic mass are arranged within a footprint of the hermetically sealed recess,
wherein the support structure extends through the thickness dimension of the electrode element and extends to the sealing element to which the support structure is fixedly coupled.

6. The capacitive microelectromechanical device according to claim 1, wherein the semiconductor substrate, the support structure, the spring element, and the seismic mass form a unitary structure formed of a semiconductor material.

7. The capacitive microelectromechanical device according to claim 1, wherein the electrode element, the support structure, the spring element, and the seismic mass are formed of polycrystalline silicon.

8. The capacitive microelectromechanical device according to claim 1, wherein the electrode element is electrically connected to the support structure such that a sensor signal indicating a current capacitance of the capacitor or a charge of the current capacitance of the capacitor is transmitted from the capacitor, through the support structure, to the semiconductor substrate.

9. A capacitive microelectromechanical device, comprising:
a semiconductor substrate comprising a base portion and sidewall portions that extend from the base portion, wherein a recess is defined by the base portion and the sidewall portions;
a support structure arranged within the recess, wherein the support structure is fixedly connected to the base portion of the semiconductor substrate and a longest dimension of the support structure extends from the base portion in a direction parallel with the sidewall portions;
an electrode element fixedly connected to the support structure, wherein the electrode element is a plate having a thickness dimension that extends in the direction parallel to the sidewall portions, wherein the support structure extends from the base portion through the electrode element along the thickness dimension;
a spacer element arranged between and connected directly to both the support structure and the electrode element;
a spring element arranged within the recess and connected to the support structure;
a seismic mass arranged within the recess and connected to the support structure by the spring element so that the seismic mass is displaceable with respect to the electrode element in the direction parallel to the sidewall portions; and
wherein the seismic mass and the electrode element form a capacitor having a capacitance which depends on a displacement between the seismic mass and the electrode element, the displacement being measured in the direction parallel to the sidewall portions.

10. The capacitive microelectromechanical device according to claim 9, wherein the spacer element forms a gap between the electrode element and the seismic mass such that the capacitor is formed by the electrode element and the seismic mass.

11. The capacitive microelectromechanical device according to claim 10, wherein the spacer element is configured to form a dielectric isolation between the electrode element and the support structure, such that the spacer element is configured to prevent charge carriers from moving from the electrode element to the support structure.

12. The capacitive microelectromechanical device according to claim 9, wherein the semiconductor substrate, the support structure, the spring element, and the seismic mass form a unitary structure formed of a semiconductor material.

13. The capacitive microelectromechanical device according to claim 9, wherein the electrode element, the support structure, the spring element, and the seismic mass are formed of polycrystalline silicon.

* * * * *